US006392938B1

United States Patent
Choi et al.

(10) Patent No.: US 6,392,938 B1
(45) Date of Patent: May 21, 2002

(54) SEMICONDUCTOR MEMORY DEVICE AND METHOD OF IDENTIFYING PROGRAMMED DEFECTIVE ADDRESS THEREOF

(75) Inventors: Jong-Hyun Choi; Sang-Seok Kang, both of Suwon; Yun-Sang Lee, Youngin, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/955,635

(22) Filed: Sep. 19, 2001

(51) Int. Cl.[7] .............................................. G11C 7/00
(52) U.S. Cl. ...................................... 365/200; 365/201
(58) Field of Search .............................. 365/200, 201, 365/225.7, 230.01

(56) References Cited

U.S. PATENT DOCUMENTS 5,519,657 A * 5/1996 Arimoto .................... 365/201

\* cited by examiner

Primary Examiner—Vu A. Le
(74) Attorney, Agent, or Firm—F. Chau & Associates, LLP

(57) ABSTRACT

A semiconductor memory device comprises a memory cell array, a defective address programming means, a redundant enable signal generating means, an output means, and a mode control signal setting means. The memory cell array comprises a plurality of memory cells. The defective address programming means programs a redundant control signal and a defective address of a defective memory cell among the plurality of the memory cells at a package level in response to a first control signal and an address signal applied from an external portion. The redundant enable signal generating means generates a comparison coincident signal in response to the redundant control signal when the address is consistent with the defective address. The output means outputs the comparison coincident signal to an external portion in response to a second control signal during a test operation. The mode control signal setting means sets a state of the first and second control signals in response to a command signal and a mode setting signal applied from an external portion.

20 Claims, 8 Drawing Sheets

US 6,392,938 B1

SEMICONDUCTOR MEMORY DEVICE AND METHOD OF IDENTIFYING PROGRAMMED DEFECTIVE ADDRESS THEREOF

CROSS REFERENCE TO RELATED APPLICATIONS

This application claims the benefit of Korean Patent Application No. 2000-70039, filed on Nov. 23, 2000, under 35 U.S.C. §119, the disclosures of which are incorporated by reference herein in their entirety.

BACKGROUND OF THE INVENTION

1. Field of the Invention

The invention relates to a semiconductor memory device, and more particularly, to a semiconductor memory device and a method of identifying programmed defective addresses thereof.

2. Description of Related Art

Typically, semiconductor memory device are manufactured with redundant memory cells to replace defective memory cells identified during the manufacturing process, thereby improving manufacturing yield.

The memory cell array of a typical semiconductor memory device will generally comprise a plurality of memory cell array blocks each containing normal memory cell array blocks and redundant memory cell array blocks. When a defective memory cell is found in the memory cell array block, the address of the defective memory cell is programmed to access a redundant memory cell instead of the defective one, usually by use of a fuse circuit, wherein fuses representing individual bits are cut by laser as needed to divert the data bus to read and write to the redundant cell.

However, even though defective memory cells may be detected and replaced at the wafer-level of manufacture, defective memory cell arrays are still occasionally found later at the package level. Of defects at the package level, more than about 80% comes from failure of no more than one or two 1-bit or 2-bit memory cells. Thus, if the defective memory cells of 1-bit or 2-bit can be repaired, manufacturing yield of semiconductor memory devices can be significantly improved. To correct the problem at the package level, typical semiconductor memory devices also comprise a redundant fuse circuit to repair the defective memory cells at a package level. Such redundant fuse circuits program defective addresses not by laser-blowing a fuse directly, but by electrically blowing an electrical fuse.

However, because the redundant fuse program circuit performs its program operation at a package level, it cannot be externally observed whether defective addresses are exactly programmed or not or whether the redundant fuse program circuit is in use.

SUMMARY OF THE INVENTION

Disclosed is a semiconductor memory device comprising a memory cell array comprising a plurality of memory cells, a plurality of redundant fuse program circuits adapted to program a redundant control signal and a defective address of a defective memory cell among the plurality of the memory cells at a package level in response to a first control signal and an address signal applied from an external portion and generate a comparison coincident signal in response to the redundant control signal when the address is consistent with the defective address and outputting the comparison coincident signal to an external portion in response to a second control signal during a test operation, and a mode setting register adapted to set a state of the first and second control signals in response to a command signal and a mode setting signal applied from an external portion.

In another aspect of the invention, a signal output circuit is adapted to receive a redundant control signal from said fuse program circuit outputted by said fuse program circuit in response to the second control signal.

In another aspect of the invention, the mode setting register is adapted to set a state of the first control signal, a test mode signal, and a normal mode signal in response to the command signal and the mode setting signal during a test operation at a package level; and further comprises a control signal generating circuit adapted to generate a signal applied from an external portion in response to the test mode signal as the second control signal and disabling the second control signal in response to the normal mode signal.

In another aspect of the invention, the control signal generating circuit comprises a CMOS transmission gate for transmitting the signal applied from the external portion in response to the test mode signal, a first latch for inverting and latching an output signal of the CMOS transmission gate, an inverter for inverting an output signal of the first latch to generate the second control signal, and a reset transistor for resetting the second control signal in response to the normal mode signal.

In another aspect of the invention, the redundant fuse program circuit comprises a redundant control signal generating circuit for generating a redundant control signal in response to the first control signal, and a defective address programming circuit for receiving the address in response to the first control signal to program a fuse, so that the defective address is programmed.

In another aspect of the invention, the redundant control signal generating circuit comprises a first fuse connected between a power voltage and a first node, a first NMOS transistor serially connected between the first node and a ground voltage and receiving the address and the first control signal, and a second latch for inverting and latching an output signal of the first node to be outputted.

In another aspect of the invention, the defective address programming circuit comprises a second fuse connected between a power voltage and a second node, second and third NMOS transistors serially connected between the second node and a ground voltage and receiving the address and the first control signal, and a third latch for inverting and latching an output signal of the second node to be outputted.

In another aspect of the invention, a data output buffer for buffering and outputting a signal outputted from the signal output circuit to an external portion during a test operation.

Disclosed is a memory cell array comprising a plurality of memory cells, a defective address programming means for programming a redundant control signal and a defective address of a defective memory cell among the plurality of the memory cells at a package level in response to a first control signal and an address signal applied from an external portion, an output means for outputting the defective address outputted from the defective address programming means to an external portion in response to a second control signal during a test operation, and a mode control signal setting means for setting a state of the first and second control signals in response to a command signal and a mode setting signal applied from an external portion.

In another aspect of the invention, the output means further outputs the redundant control signal in response to the second control signal.

In another aspect of the invention, the mode control signal setting means comprises a mode setting register for setting a state of the first control signal, a test mode signal and a normal mode signal in response to the command signal and the mode setting signal during a test operation at a package level, a control signal generating means for generating a signal applied from an external portion in response to the test mode signal as the second control signal and disabling the second control signal in response to the normal mode signal.

In another aspect of the invention, the control signal generating means comprises a CMOS transmission gate for transmitting the signal applied form the external portion in response to the test mode signal, a first latch for inverting and latching an output signal of the CMOS transmission gate, an inverter for inverting an output signal of the first latch to generate the second control signal, and a reset transistor for resetting the second control signal in response to the normal mode signal.

In another aspect of the invention, the defective address programming means comprises a redundant control signal generating circuit for generating a redundant control signal in response to the first control signal, and a defective address programming circuit for receiving the address in response to the first control signal to program a fuse, so that the defective address is programmed.

In another aspect of the invention, the redundant control signal generating circuit comprises a first fuse connected between a power voltage and a first node, a first NMOS transistor serially connected between the first node and a ground voltage and receiving the address and the first control signal, and a second latch for inverting and latching an output signal of the first node to be outputted.

In another aspect of the invention, the defective address programming circuit comprises a second fuse connected between a power voltage and a second node, second and third NMOS transistors serially connected between the second node and a ground voltage and receiving the address and the first control signal, and a third latch for inverting and latching an output signal of the second node to be outputted.

In another aspect of the invention, the output means comprises a signal output means for outputting the redundant control signal and the defective address in response to the second control signal, and a data output buffer for buffering and outputting a signal outputted from the signal output circuit to an external portion during a test operation.

Disclosed is a method of identifying a programmed defective address in a semiconductor memory device having a memory cell array comprising a plurality of memory cells and a defective address programming means for programming a defective address of a defective memory cell among the plurality of the memory cells at a package level in response to a first control signal and an address signal applied from an external portion, the method comprising generating a first control signal in response to a command signal and a mode setting signal applied from an external portion, programming the defective address programming means in response to the first control signal and a defective address applied from an external portion to generate a redundant control signal and a defective address, generating a second control signal in response to the command signal and the mode setting signal, and outputting a comparison coincident signal to an external portion in response to the second control signal when an address applied from an external portion is consistent with the defective address.

In another aspect of the invention, the method further comprises outputting the redundant control signal to an external portion in response to the second control signal.

Disclosed is a method of identifying a programmed defective address in a semiconductor memory device having a memory cell array comprising a plurality of memory cells and a defective address programming means for programming a defective address of a defective memory cell among the plurality of the memory cells at a package level in response to a first control signal and an address signal applied from an external portion, the method comprising generating a first control signal in response to a command signal and a mode setting signal applied from an external portion, programming the defective address programming means in response to the first control signal and a defective address applied from an external portion to generate a redundant control signal and a defective address, generating a second control signal in response to the command signal and the mode setting signal, and outputting the defective address to an external portion in response to the second control signal.

In another aspect of the invention, the method further comprises outputting the redundant control signal to an external portion in response to the second control signal.

DETAILED DESCRIPTION OF PREFERRED EMBODIMENTS

Figure 1:
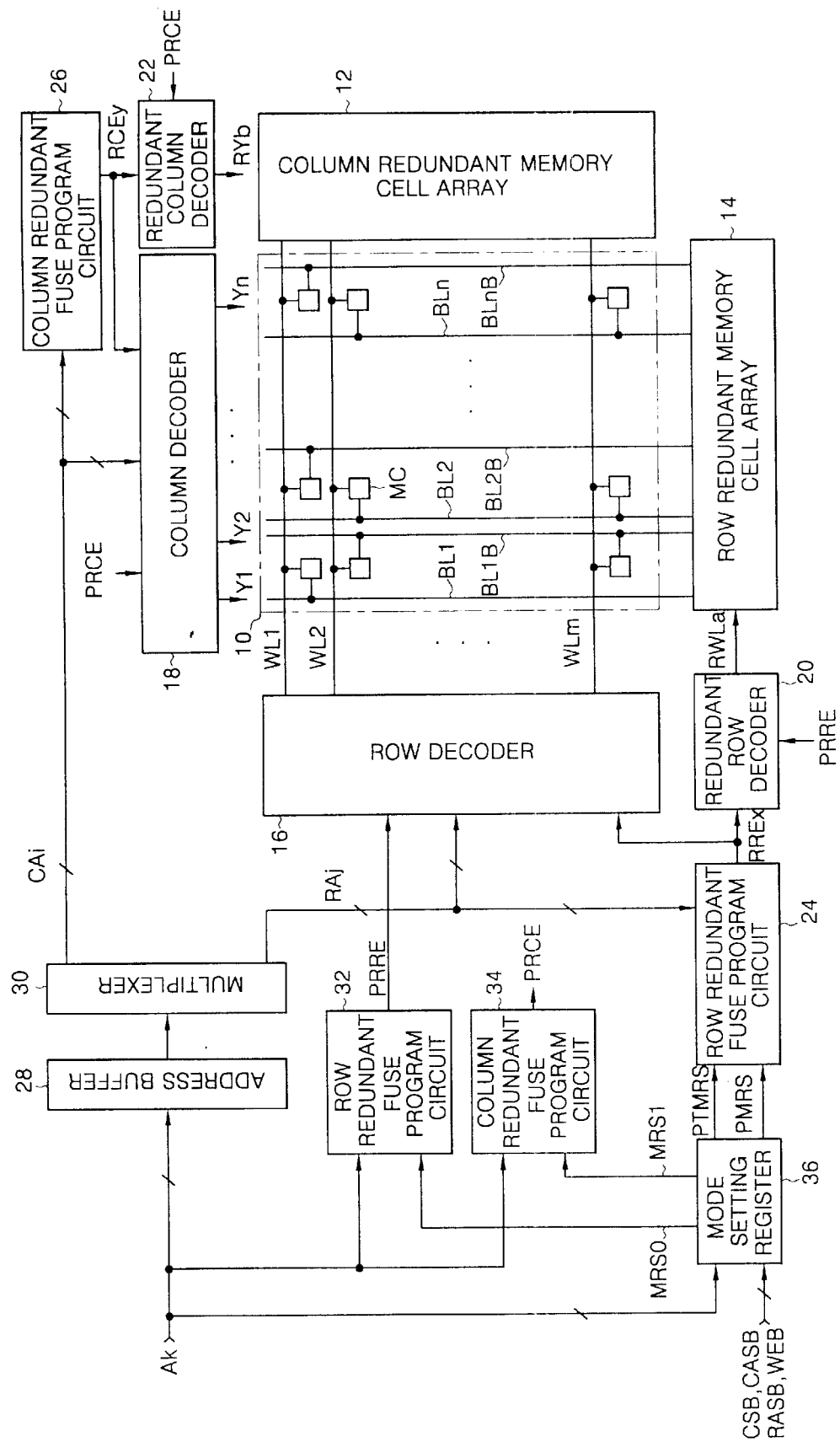
FIG. 1 is a block diagram illustrating a configuration of a conventional semiconductor memory device.

Referring to FIG. 1, there is shown a conventional semiconductor memory device having a conventional memory cell array 10, a column redundant memory cell array 12, a row redundant memory cell array 14, a row decoder 16, a column decoder 18, a redundant row decoder 20, a redundant column decoder 22, a row redundant fuse program circuit 24, a column redundant fuse program circuit 26, an address buffer 28, a multiplexer 30, a row redundant fuse program circuit 32, a column redundant fuse program circuit 34, and a mode setting register 36.

The row and column redundant fuse program circuits 24 and 26 serve to repair defective memory cells at wafer level, and the row and column redundant fuse program circuits 32 and 34 are to repair defective memory cells at package level.

The conventional memory cell array 10 comprises a plurality of memory cells MC connected between an m number of word lines WL1 to WLm and an n number of bit line pairs BL1/BL1B . . . BLn/BLnB and receives or outputs data through the bit line pairs BL1/BL1B . . . BLn/BLnB. The column redundant memory cell array 12 comprises redundant memory cells (not shown) connected between the m number of the word lines WL1 to WLm and a set of redundant bit line pairs (not shown) and receives or outputs data therethrough. By this arrangement, the column redundant memory cell array 12 may replace defective memory cells with the memory cells connected to the redundant bit line pairs when defects are found in the memory cells of the conventional memory cell array 10.

The row redundant memory cell array 14 comprises redundant memory cells (not shown) connected between a set of redundant word lines (not shown) and the n number of the bit line pairs BL1/BL1B . . . BLn/BLnB and receives or outputs data through the n number of the bit line pairs BL1/BL1B . . . BLn/BLnB. The row redundant memory cell array 14 replaces defective memory cells with the memory cells connected to the redundant word lines RWLa when defects are found in the memory cells of the conventional memory cell array 10. The row decoder 16 decodes a row address RAj to generate a signal to choose the n number of the word lines WL1 to WLm and is disabled in response to row redundant enable signals PREx and PRRE. The column decoder 18 decodes a column address CAi to generate an n number of column selecting signals Y1 to Yn and is disabled in response to the column redundant enable signals PCEy and PRCE. The redundant row decoder 20 decodes the row redundant enable signals PREx and PRRE to generate a signal so as to choose an a number of redundant word lines RWLa. The redundant column decoder 22 decodes the column redundant enable signals PCEy and PRCE to generate a b number of redundant column selecting signals RYb. The row redundant fuse program circuit 24 generates the row redundant enable signal RREx when a defective address is programmed in a wafer level and the row address RAj applied during a normal operation is the programmed defective address. The column redundant fuse program circuit 26 generates the column address enable signal RCEy when a defective address is programmed in a wafer level, and the column address CAj applied during a normal operation is the programmed defective address. The address buffer 28 buffers an address Ak. The multiplexer 30 generates an address received from the address buffer 28 as the row address RAj when an inverted row address strobe signal RASB becomes active and as the column address CAj when an inverted column address strobe signal CASB becomes active. The package level row redundant fuse program circuit 32 is enabled in response to a control signal MRS0 at package level, receives the defective row address Ak to program a defective row address, and generates the row redundant enable signal PRRE when the row address Ak is detected to be a defective row address. The package level column redundant fuse program circuit 34 is enabled in response to a control signal MRS1 at package level, receives the defective column address Ak to program defective column address, and generate the column redundant enable signal PRCE when the column address Ak is detected to be a defective column address. The mode setting register 36 sets and outputs mode control signals PTMRS and PMRS and the control signals MRS0 and MRS1 in response to a signal inputted through a pin (not shown) of applying an address Ak when an inverted chip selecting signal CSB, an inverted row address strobe signal RASB, inverted column address strobe signal CASB, and an inverted write enable signal WEB, which all have a logic "low" level, are applied.

Figure 2:
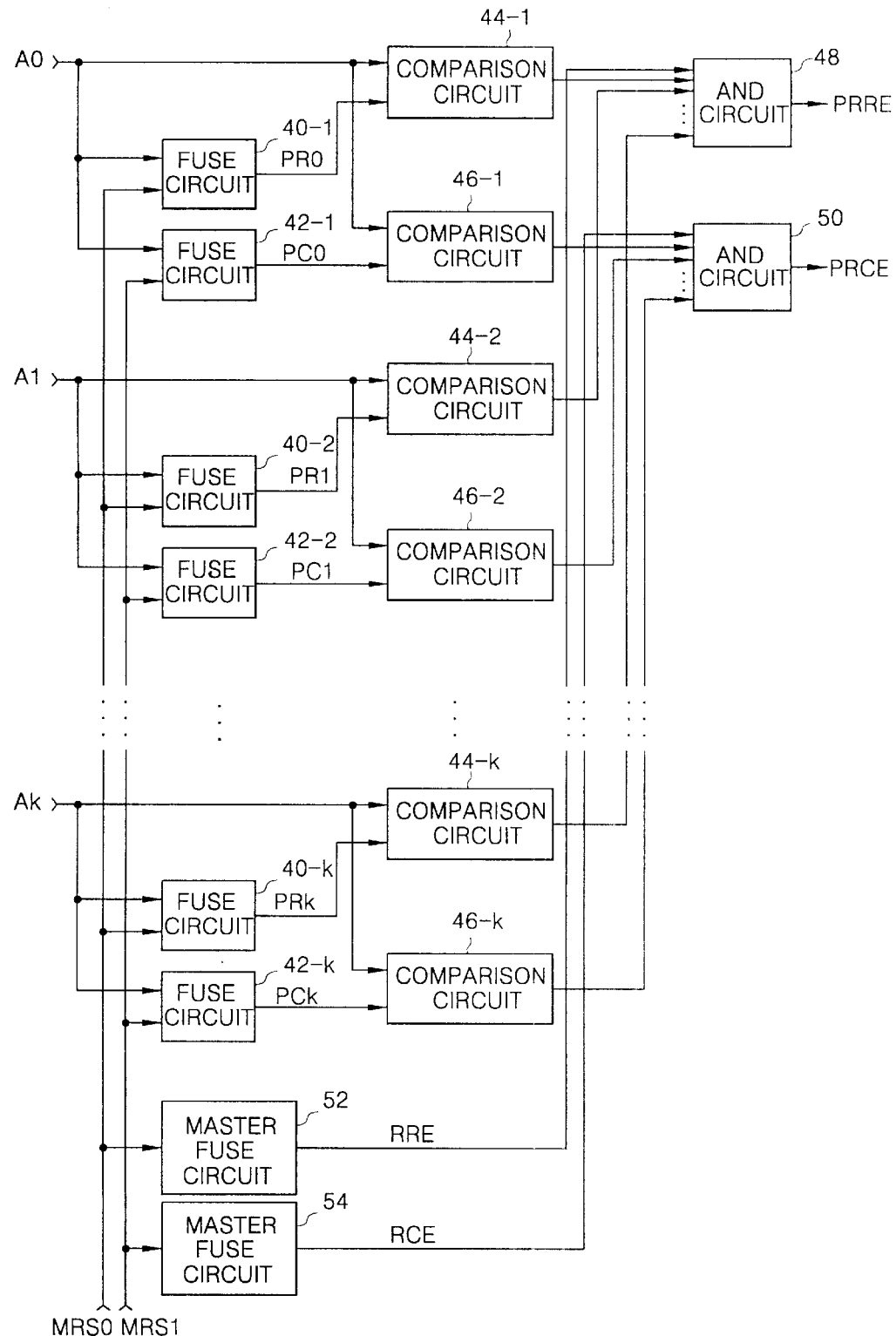
FIG. 2 is a block diagram illustrating a configuration of row and column redundant fuse program circuits of the conventional semiconductor memory device of FIG. 1.

FIG. 2 is a block diagram illustrating a configuration of the package level row and column redundant fuse program circuits 32 and 34 of FIG. 1. The row redundant fuse program circuit 32 portion comprises fuse circuits 40-1 to 40-k, comparison circuits 44-1 to 44-k, an AND circuit 48, and a master fuse circuit 52. The column redundant fuse program circuit 34 portion comprises fuse circuits 42-1 to 42-k, comparison circuits 46-1 to 46-k, an AND circuit 50, and a master fuse circuit 54.

The fuse circuits 40-1 to 40-k are programmed by defective row addresses applied to the addresses A0 to Ak in response to the control signal MRS0 to output defective row addresses PR0 to PRk at a package level. The fuse circuits 42-1 to 42-k are programmed by defective column addresses applied to the addresses A0 to Ak in response to the control signal MRS1 to output defective column addresses PC0 to PCk at a package level.

The comparison circuits 44-1 to 44-k compare the address A0 to Ak with the output signals PR0 to PRk of the fuse circuits 40-1 to 40-k and generate a comparison coincident signal, respectively, when the address A0 to Ak are identical to the output signal PR0 to PRk of the fuse circuits 40-1 to 40-k. Likewise, comparison circuits 46-1 to 46-k compare the address A0 to Ak with the output signals PC0 to PCk of the fuse circuits 42-1 to 42-k and generate a comparison coincident signal, respectively, when the addresses A0 to Ak are identical to the output signals PC0 to PCk of the fuse circuits 42-1 to 42-k.

The master fuse circuit 52 generates the row redundant control signal RRE in response to the control signal MRS0. The master fuse circuit 54 generates the column redundant control signal RCE in response to the control signal MRS1.

The AND circuit 48 generates the row redundant enable signal PRRE by ANDing the comparison coincident signal from the comparison circuits 44-1 to 44-k and the row redundant control signal RRE. The AND circuit 50 generates the column redundant enable signal PRCE by ANDing the comparison coincident signals from the comparison circuits 46-1 to 46-k and the column redundant control signal RCE.

Figure 3:
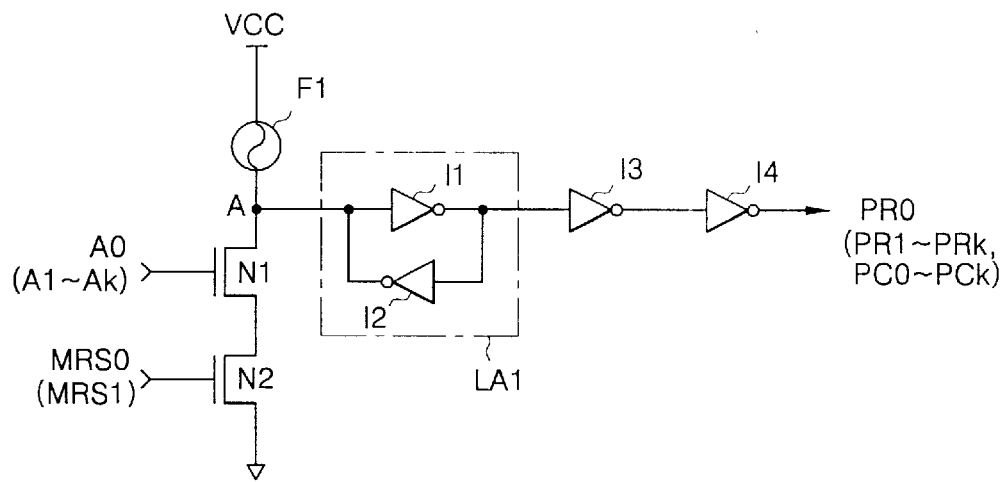
FIG. 3 is a circuit diagram illustrating a configuration of a fuse circuit of the row and column redundant fuse program circuits of FIG. 2.

FIG. 3 is a circuit diagram illustrating a configuration of the conventional fuse circuit of FIG. 2. The fuse circuit comprises a fuse F1, NMOS transistors N1 and N2, a latch LA1 having inverters I1 and I2, and inverters I3 and I4.

An operation of the fuse circuit of FIG. 3 is as follows. In the case of programming the defective address, when the control signal MRS0 (MRS1) having a logic "high" level is applied, the NMOS transistor N2 is turned on. When a signal having a logic "high" level is applied to the address A0 (A1 to Ak), the NMOS transistor N1 is turned on. As a result, a node A becomes a logic "low" level, and a current flows along the fuse F1. At this moment, when a current of higher than a rated current flows along the fuse F1, the fuse F1 is blown. The latch LA1 inverts and latches the signal having a logic "low" level to generate a signal having a logic "high" level. The circuit having inverters I3 and I4 buffers the signal having a logic "high" level to generate the defective row address signal PR0 (PR1 to PRk, PC0 to PCk) having a logic "high" level.

On the other hand, when a signal having a logic "low" level is applied to the address A0 (A1 to Ak), the fuse F1 is not disconnected. Therefore, the node A remains at a logic "high" level. The latch LA1 inverts and latches the signal having a logic "high" level to generate a signal having a logic "low" level. The circuit having inverters I3 and I4 buffers the signal having a logic "low" level to generate the defective row address signal PR0 (PR1 to PRk, PC0 to PCk) having a logic "low" level.

That is, when the control signal MRS0 (MRS1) having a logic "high" level and the address A0 (A1 to Ak) having a logic "high" level are applied, the fuse circuit generates the defective row address signal PR0 (PR1 to PRk, PC0 to PCk) having a logic "high" level. When the control signal MRS0 (MRSI) having a logic "high" level and the address A0 (A1 to Ak) having a logic "low" level are applied, the fuse circuit generates the defective row address signal PR0 (PR1 to PRk, PC0 to PCk) having a logic "low" level.

Figure 4:
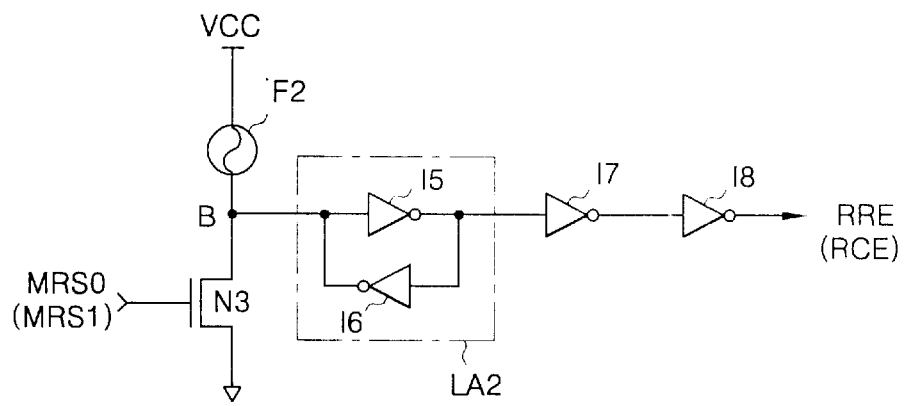
FIG. 4 is a circuit diagram illustrating a configuration of the master fuse circuit of the row and column redundant fuse program circuits of FIG. 2.

FIG. 4 is a circuit diagram illustrating a configuration of the master fuse circuit of FIG. 2. As shown in FIG. 4, the master fuse circuit comprises a fuse F2, an NMOS transistor N3, a latch LA2 having inverters I5 and I6, and inverters I7 and I8.

An operation of the fuse circuit of FIG. 4 is as follows. In the case of programming the defective address, when the control signal MRS0 (MRS1) having a logic "high" level is applied, the NMOS transistor N3 is turned on. As a result, a node B becomes a logic "low" level, and a current flows along the fuse F2 and the fuse is thus blown if the supplied current is higher than rated. The latch LA2 inverts and latches the signal having a logic "low" level to generate a signal having a logic "high" level. Inverters I7 and I8 buffer the signal having a logic "high" level to generate the redundant control signal RRE (RCE) having a logic "high" level.

On the other hand, when the control signal MRS0 (MRS1) having a logic "low" level is applied, the NMOS transistor N3 is turned off, and the master fuse circuit generates the redundant control signal RRE (RCE) having a logic "low" level.

Hence, the master fuse circuit generates the redundant control signal RRE (RCE) having a logic "high" level when the control signal MRS0 (MRS1) having a logic "high" level is applied, and generates the redundant control signal RRE (RCE) having a logic "low" level when the control signal MRS0 (MRS1) having a logic "low" level is applied.

Referring generally to FIGS. 1 through 4 as an example of package level redundancy of the conventional art, assume that defective memory cells are found among the memory cells connected to the word line WL1 of the conventional memory cell array 10 by a test at a package level, and the defective memory cells connected to the corresponding word line WL1 are replaced with the redundant memory cells connected to the redundant word line RWLa of the row redundant memory cell array 14. In this example, for simplicity, assume the defective row address is the zeroth address, namely "00 . . . 0".

Command signals CSB, CASB, RASB, and WEB are brought to logic "low" level and applied to the mode setting register 36, so that the test mode signal PTMRS goes to a logic "high" level, and the control signal MRS0 goes to a logic "high" level, and the control signal MRS1 goes to a logic "low" level. As a result, the row redundant fuse program circuit 32 goes into a programmable state, and the column redundant fuse program 34 remains non-programmable. In this state, when the defective row address "00 . . . 0" as the inverted row address strobe signal RASB having a logic "low" level and the address Ak are inputted, the defective row address "00 . . . 0" is programmed.

As another example, assume that defective memory cells are found among the memory cells connected to the bit line pair BL2 and BL2B of the conventional memory cell array 10 by a test at a package level, and the defective memory cells connected to the corresponding bit line pair BL2 and BL2B are replaced with the redundant memory cells connected to the redundant bit line pair BL2 and BL2B of the column redundant memory cell array 12. In this example, the defective column address is found to be "00 . . . 1". The to command signals CSB, CASB, RASB, and WEB are brought to logic "low" level and again applied to the mode setting register 36, the test mode signal PTMRS goes to a logic "high" level, and the control signal MRS0 goes to a logic "low" level, and the control signal MRS1 goes to a logic "high" level. As a result, the row redundant fuse program 32 enters a state which can be programmed, while the column redundant fuse program 34 remains unprogrammable. In this state, when the inverted column address strobe signal CASB having a logic "low" level and the defective column address "00 . . . 1" as the address Ak are inputted, the defective column address "00 . . . 1" is programmed.

In a normal operation of the conventional semiconductor memory device, the command signals CSB, CASB, RASB, and WEB are applied to the mode setting register 36, and the mode setting signals are inputted to the pins for applying the address Ak so that a normal mode signal PMRS may be set to a logic "high" level, and the control signals MRS0 and MRS1 may be set to a logic "low" level.

Thereafter, when the detected defective address "00 . . . 0" is inputted to the pins for applying the row address Ak in response to the inverted row address strobe signal RASB having a logic "low" level, the row redundant fuse program circuit 32 generates the row redundant enable signal PRRE, thereby disabling the row decoder 16. The redundant row decoder 20 decodes the redundant enable signals PREx and PRRE to generate a signal so as to choose the redundant word line RWLa. Therefore, the redundant memory cell is selected, which is connected to the selected word line of the row redundant memory cell array 14.

When an address "00 . . . 0" is inputted to the pins for applying the address Ak in response to the inverted column address strobe signal CASB having a logic "low" level, to the column redundant fuse program circuit 34 does not generate the column redundant enable signal PRCE because the control signal MRS1 is at logic "low". Hence, the inputted column address "00 . . . 0" is inputted to the column decoder 18 through the address buffer 28 and the multiplexer 30. The column decoder 18 decodes the signal CAi that the column address "00 . . . 0" is buffered to choose the column selecting signal Y1. As a result, the memory cells that are connected between the selected redundant word line of the row redundant memory cell array 14 and the bit line pair BL1 and BL1B are accessed.

Typically, after the conventional semiconductor memory device programs the defective address at a package level using the row and column redundant fuse program circuits 32 and 34, the operation of the device is tested again. However, although the defective address is programmed, the semiconductor memory device may be detected as a defective device during a test operation. The tester then cannot identify from the outside whether the defective address is properly programmed or not nor whether the redundant fuse program circuits 32 and 34 are in use or not.

Figure 5:
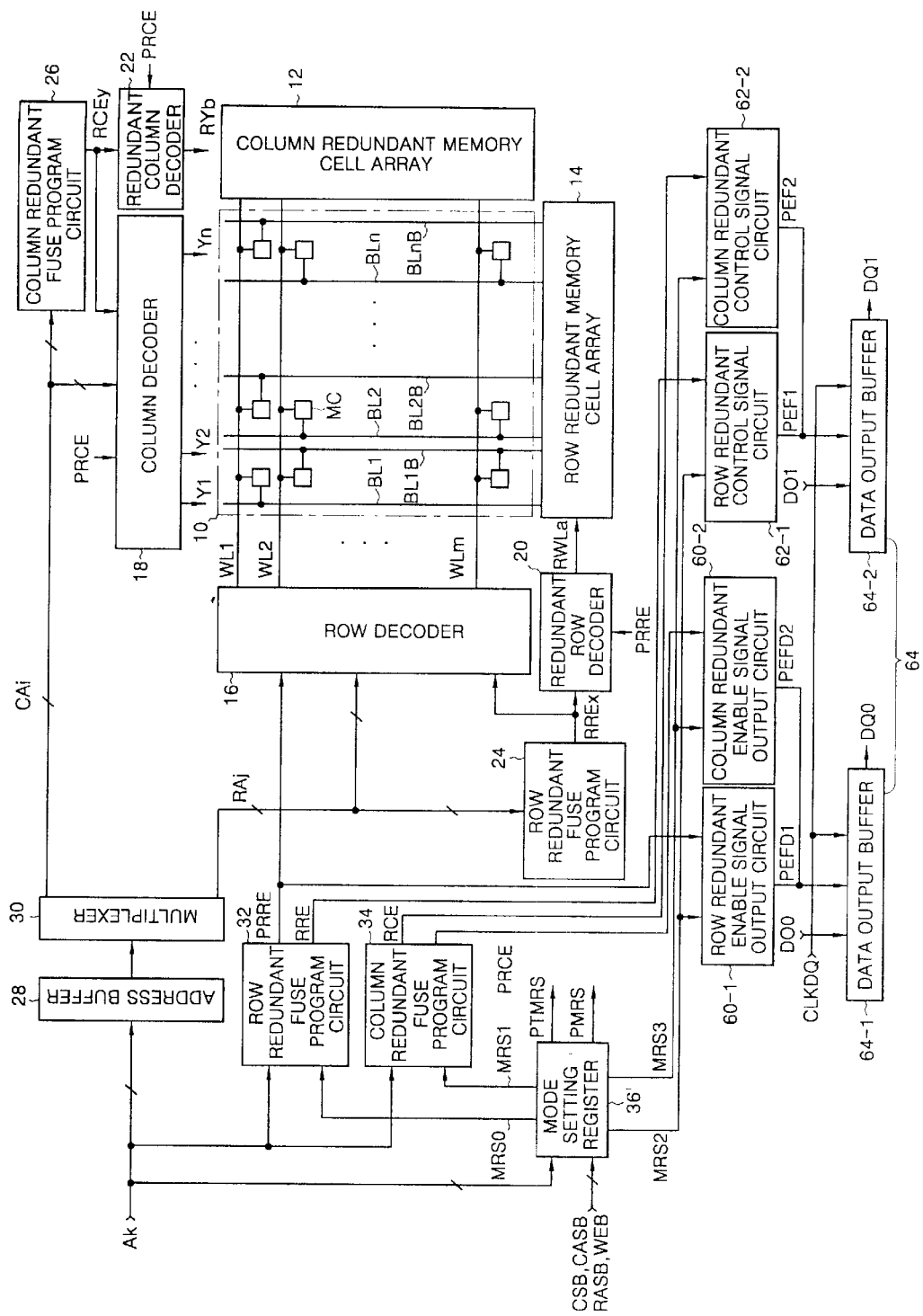
FIG. 5 is a block diagram illustrating a configuration of a semiconductor memory device according to a preferred embodiment of the invention.

FIG. 5 is a block diagram illustrating a configuration of a semiconductor memory device according to a preferred embodiment of the invention. In addition to the conventional semiconductor memory device of FIG. 1, the inventive semiconductor memory device further comprises row and column redundant enable signal output circuits 60-1 and 60-2, row and column redundant control signal output circuits 62-1 and 62-2, and data output buffers 64-1 and 64-2. Also, a mode setting register 36' substitutes for the mode setting register 36 of FIG. 1. The data output buffer 64 of FIG. 5 is not a newly added feature, but rather a feature provided in a data I/O terminal of the conventional semiconductor memory device that was not shown in FIG. 1.

Like references of FIGS. 1 and 5 denote like components that perform like operations, thus their explanation is omitted.

As with the conventional device, the mode setting register 36' generates the test mode signal PTMRS and the control signals MRS0 and MRS1 at logic "high" in response to a mode setting signal inputted to the pins (not shown) for applying the address Ak when the command signals CSB, CASB, RASB, and WEB having a logic "low" level are applied. Also, in order to identify whether the defective address are properly programmed, when the command signals CSB, CASB, RASB, and WEB having a logic "low" level are applied, the mode setting register 36' generates the control signals MRS2 and MRS3 having a logic "high" level in response to the mode setting signal inputted to the pins (not shown) for applying the address Ak.

The row redundant enable signal output circuit 60-1 receives the row redundant enable signal PRRE from the package level row redundant fuse program circuit 32 and generates it as a signal PEFD1 in response to the control signal MRS2 having a logic "high" level. The column redundant enable signal output circuit 60-2 receives the column redundant enable signal PRCE from the column redundant fuse program circuit 34 and generates it as a signal PEFD2 in response to the control signal MRS3 having a logic "high" level.

The row redundant control signal output circuit 62-1 generates a signal PEF1 from the redundant control signal RRE in response to the control signal MRS2 having a logic "high" level. The column redundant control signal output circuit 62-2 generates a signal PEF2 from the redundant control signal RCE in response to the control signal MRS3 having a logic "high" level.

The data output buffer 64-1 receives and buffers a data output signal DO0 from memory in response to a clock signal CLKDQ during normal operation and outputs it as the data output DQ0. During package level testing, the data output buffer 64-1 buffers and outputs signals PEFD1 and PEFD2 as the data DQ0. The data output buffer 64-2 receives and buffers a data output signal DO1 from memory in response to the clock signal CLKDQ during normal operation and outputs it as data output DQ1. During package level testing, the data output buffer 64-2 buffers and outputs signals PEF1 and PEF2.

As can be seen in FIG. 5, the semiconductor memory device of the invention outputs the redundant output enable signals PRRE, RRE, PRCE, and RCE outputted from the redundant fuse program circuits 32 and 34 to the external data bus, and thus it can be identified externally whether the defective address is properly programmed or not. Also, because the redundant control signal is outputted to the outside, it can be identified externally whether the redundant fuse program circuits 32 and 34 are in use or not.

In the semiconductor memory device of FIG. 5, the mode setting register 36' directly generates the control signals MRS2 and MRS3. In general, the mode setting register 36' generates signals PTMRS and PMRS to discriminate whether the semiconductor memory device is in the test mode or the normal mode. Therefore, the semiconductor memory device can be configured to generate the control signals MRS2 and MRS3 using the signals PTMRS and PMRS.

Figure 6:
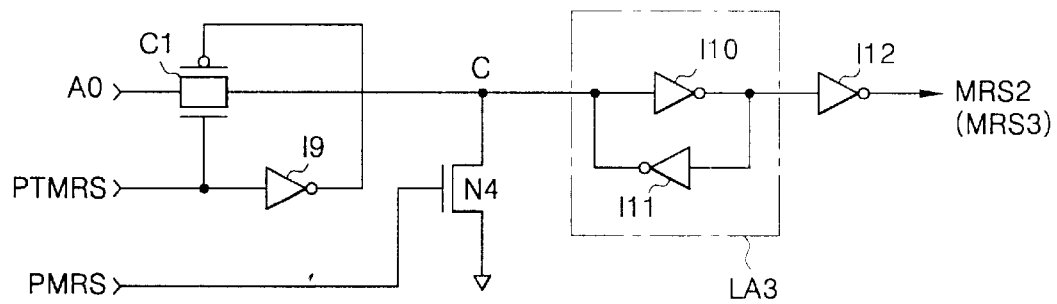
FIG. 6 is a circuit diagram of a circuit for generating control signals of the semiconductor memory device of FIG. 5.

FIG. 6 is a circuit diagram illustrating a control signal generating circuit for generating the control signals MRS2 and MRS3 and is a sub-component of the mode setting register 36' of FIG. 5. The control signal generating circuit comprises a CMOS transmission gate C1, inverters I9 and I12, an NMOS transistor N4, and a latch LA3 having inverters I10 and I11.

An operation of the control signal generating circuit of FIG. 6 is as follows. The CMOS transmission gate C1 transmits the address bit A0 under control of test mode signal PTMRS. In this embodiment, A0 is transmitted when PTMRS is at a logic "high" level. The latch LA3 inverts and latches the address A0. The inverter I12 inverts an output signal of the latch LA3 to be outputted as the control signal MRS2 (MRS3).

That is, when the test mode signal PTMRS having a logic "high" level is applied, and the address A0 having a logic "high" level is applied, the control signal generating circuit generates the control signal MRS2 (MRS3) having a logic "high" level. When the test mode signal PTMRS having a logic "low" level is applied, and the address A0 having a logic "low" level is applied, the control signal generating circuit generates the control signal MRS2 (MRS3) having a logic "low" level. Further, when the normal mode signal PMRS having a logic "high" level is generated during the normal operation, the NMOS transistor N4 is turned on, so that a node C becomes a logic "low" level. The latch LA3 inverts and latches the signal having a logic "low" level to generate a signal having a logic "high" level. The inverter I12 inverts the signal having a logic "high" level to generate the control signal MRS2 (MRS3) having a logic "low" level.

Figure 7:
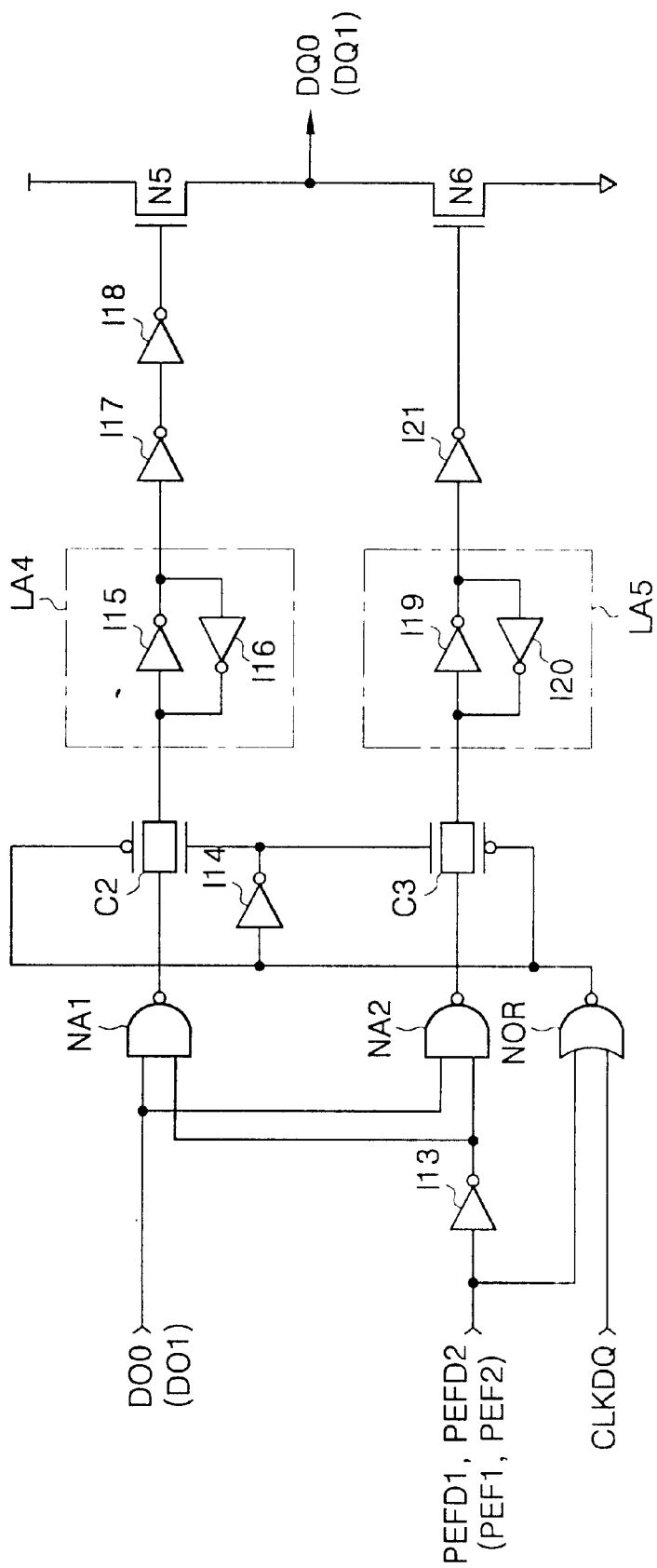
FIG. 7 is a circuit diagram illustrating a configuration of the data output buffer of the semiconductor memory device of FIG. 5.

FIG. 7 is a circuit diagram illustrating a configuration of the data output buffer of FIG. 5. The data output buffer comprises inverters I13, I14, I17, I18, and I21, a NOR gate, NAND gates NA1 and NA2, CMOS transmission gates C2 and C3, a latch LA4 having inverters I15 and I16, a latch LA5 having inverters I19 and I20, and NMOS transistors N5 and N6.

An operation of the data output buffer of FIG. 7 is as follows. When the combined signal PEFD1, PEFD2 (PEF1, PEF2) having a logic "high" level is applied during a test operation at a package level, the NAND gates NA1 and NA2 generate a signal having a logic "high" level, and the NOR gate NOR generates a signal having a logic "low" level, regardless of the logic levels at DO0 or CLKDQ. The CMOS transmission gates C2 and C3 are turned on in response to the signal having a logic "low" level to transmit the logic "high" from the NAND gates NA1 and NA2. The latches LA4 and LA5 invert and latch the signal having a logic "high" level to generate a signal having a logic "low" level. The inverters I17 and I18 buffer the signal having a logic "low" level to generate a signal having a logic "low" level. The inverter I21 inverts and buffers the signal having a logic "low" level to generate a signal having a logic "high" level. The NMOS transistor N5 is turned off, and the NMOS transistor N6 is turned on, so that data DQ0 (DQ1) having a logic "low" level is generated.

Hence, when data DQ0 (DQ1) having a logic "low" level is generated, this indicates that the defective address is properly programmed in the row and column redundant fuse program circuits 32 and 34 because it shows PEFD1, PEFD2 (PEF1,PEF2) is high. When data DQ0 (DQ1) having a logic "high" level is generated, this indicates that the defective address is not properly programmed in the row and column redundant fuse program circuits 32 and 34.

During the normal operation, because the signals PEFD1 and PEFD2 (PEF1 and PEF2) are not generated, the data DO0 (DO1) are buffered in response to the clock signal CLKDQ and outputted as the data signal DQ0 (DQ1).

Though not shown, row and column redundant enable signal output circuits 60-1 and 60-2 and the row and column redundant control signal output circuits 62-1 and 62-2 may be configured by an AND circuit for ANDing two input signals or by a CMOS transmission gate for transmitting the signals PRRE, PRCE, RRE, and RCE in response to the control signals MRS2 and MRS3 having a logic "high" level.

Figure 8:
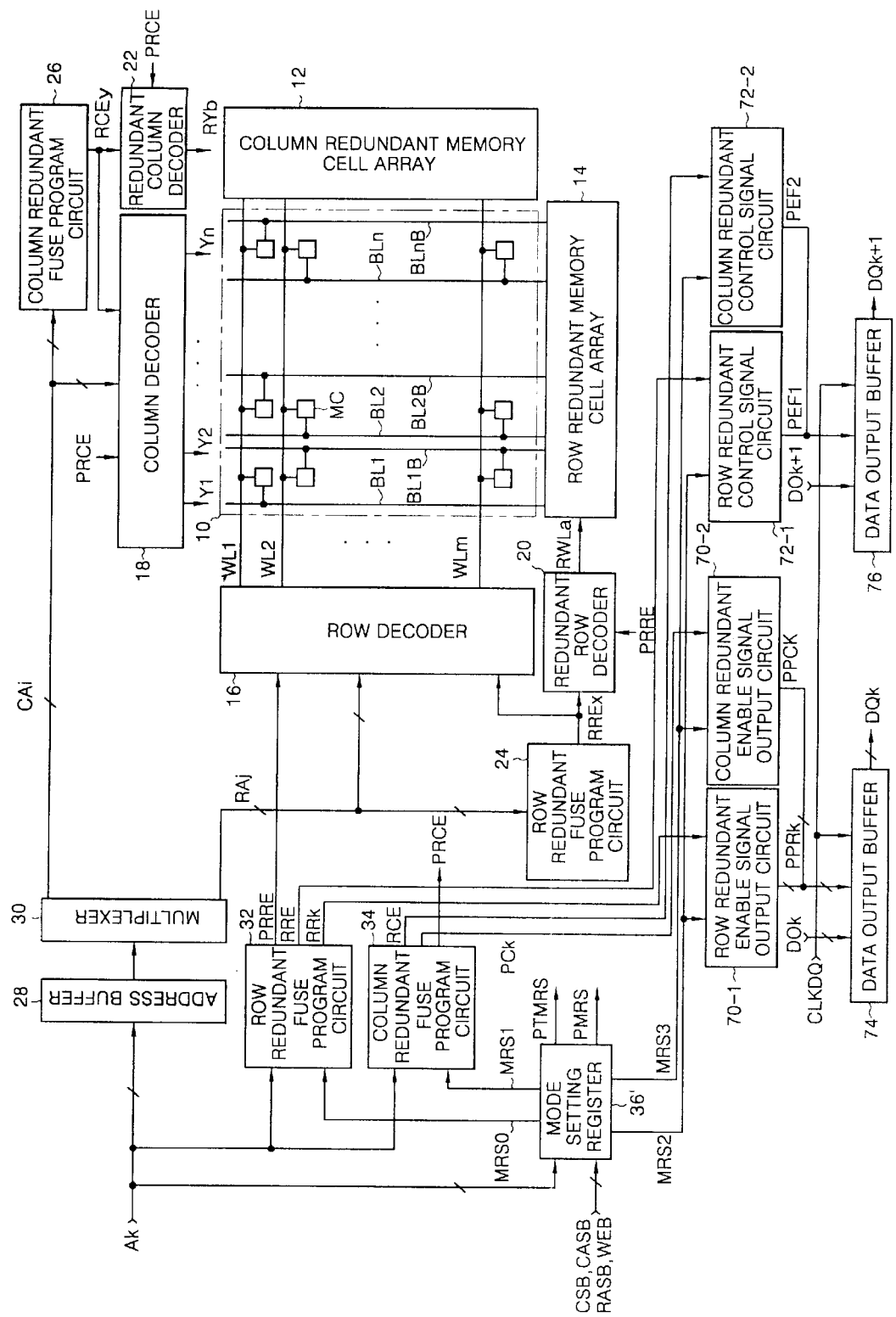
FIG. 8 is a block diagram illustrating a semiconductor memory device according to another preferred embodiment of the invention.

FIG. 8 is a block diagram illustrating a semiconductor memory device according to another preferred embodiment of the invention. As shown in FIG. 8, there are provided row and column address output circuits 70-1 and 70-2, row and column redundant control signal output circuits 72-1 and 72-2, and data output buffers 74 and 76 are added, and the mode setting register 36' substitutes for the mode setting register 36. Like references of FIGS. 1, 5, and 8 denote like components that perform like operations, and thus their explanation is omitted.

The defective row address output circuit 70-1 generates a defective row address signal PRk received from the row redundant fuse program circuit 32 as a signal PPRk in response to the control signal MRS2. The defective column address output circuit 70-2 generates a defective column address signal PCk received from the column redundant fuse program circuit 34 as a signal PPCk in response to the control signal MRS3.

The data output buffer 74 buffers data DO0 and Dok and outputs them as DQk in response to the clock signal CLKDQ during normal operations, and buffers and outputs the signal PPRk, PPCk during testing operations at package level.

The row and column redundant control signal output circuits 72-1 and 72-2 and the data output buffer 76 perform the same operation as performed by the row and column redundant control signal output circuits 62-1 and 62-2 and the data output buffer 64-2 of FIG. 5.

Because the semiconductor memory device of FIG. 8 outputs the programmed defective address through the data output buffer 74 during a test operation at a package level, the tester can identify externally whether the defective address is properly programmed. Also, like the semiconductor memory device of FIG. 5, it can be identified from the outside whether the row and column redundant fuse program circuits 32 and 34 are in use or not.

Also, the semiconductor memory device of FIG. 8 may be configured to generate the control signals MRS2 and MRS3 using signals PTMRS and PMRS, as in FIG. 5.

Figure 9:
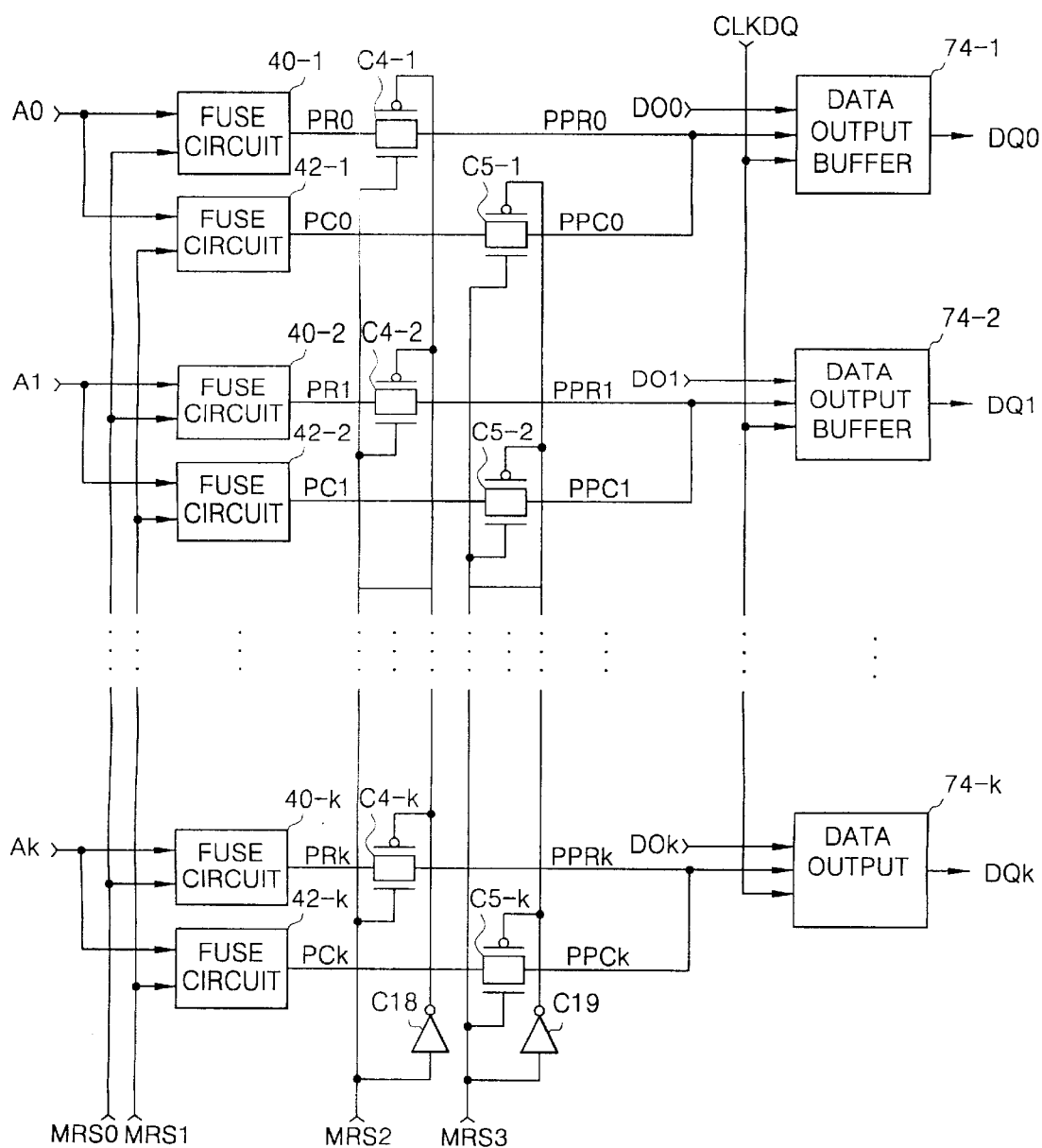
FIG. 9 is a block diagram illustrating a configuration of row and column redundant fuse program circuit of the semiconductor memory device of FIG. 8.

FIG. 9 is a block diagram illustrating a configuration of the row and column redundant fuse program circuits 32', 34' and the redundant enable signal output circuits 70-1, 70-2, and their connection to the data output buffer 74 according to another preferred embodiment of the invention. The fuse circuits 40-1 to 40-k of FIG. 9 are identical to the fuse circuits arranged in the row redundant fuse program circuit 32 of FIG. 2, and the fuse circuits 42-1 to 42-k are identical to the fuse circuits arranged in the column redundant fuse program circuit 34 of FIG. 2.

The defective row address output circuit 70-1 comprises CMOS transmission gates C4-1 to C4-k, and the defective column address output circuit 70-2 comprises the CMOS transmission gates C5-1 to C5-k.

An operation of the circuitry of FIG. 9 is as follows. The CMOS transmission gates C4-1 to C4-k transmit output signals PR0 to PRk of the fuse circuits 40-1 to 40-k in response to the control signal MRS2, meaning the output signals PR0 to PRk constitute the defective row address. The CMOS transmission gates C5-1 to C5-k generate output signals PC0 to PCk of the fuse circuits 42-1 to 42-k in response to the control signal MRS3. That is, the output signals PC0 to PCk constitute the defective column address. The data output buffers 74-1 to 74-k buffer and output the output signals PR0 to PRk or the output signals PC0 to PCk during a test operation, and buffer the data DO0 and DOk and outputs the data DO0 and DOk as the data output signals DQ0 and DQk. That is, the programmed defective row and column addresses are outputted through the data output buffers 74-1 to 74-k.

Because the semiconductor memory device according to another preferred embodiment of the invention outputs the programmed defective address to the row and column redundant fuse program circuit through the data output buffer during a test operation, the tester can identify whether the defective address is properly programmed or not. Also, because the redundant control signal is output to the outside, it can be identified from the outside whether the redundant fuse program circuits 32 and 34 are in use or not. Therefore, if the device is improperly programmed such that a memory cell is detected as defective, because the defective address can be re-programmed using an additional fuse circuit, the defective semiconductor memory device can be repaired.

Such additional fuse circuits are not shown in the Figures. They will be substantially identical to those described and configured in such a way as to be controlled by control signals in addition to the control signals MRS0 and MRS1 and generated by the mode setting register 36. Such additional fuse circuits are arranged in the row and column redundant fuse program circuits 32 and 34 (32', 34').

It is to be understood that all physical quantities disclosed herein, unless explicitly indicated otherwise, are not to be construed as exactly equal to the quantity disclosed, but rather about equal to the quantity disclosed. Further, the mere absence of a qualifier such as "about" or the like, is not to be construed as an explicit indication that any such disclosed physical quantity is an exact quantity, irrespective of whether such qualifiers are used with respect to any other physical quantities disclosed herein.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor memory device, comprising:

a memory cell array comprising a plurality of memory cells;

a plurality of redundant fuse program circuits adapted to program a redundant control signal and a defective address of a defective memory cell among the plurality of the memory cells at a package level in response to a first control signal and an address signal applied from an external portion and generate a comparison coincident signal in response to the redundant control signal when the address is consistent with the defective address and outputting the comparison coincident signal to an external portion in response to a second control signal during a test operation; and a mode setting register adapted to set a state of the first and second control signals in response to a command signal and a mode setting signal applied from an external portion.

2. The device of claim 1 further comprising a signal output circuit adapted to receive a redundant control signal from said fuse program circuit in response to the second control signal.

3. The device of claim 1, wherein the mode setting register is adapted to set a state of the first control signal, a test mode signal, and a normal mode signal in response to the command signal and the mode setting signal during a test operation at a package level; and further comprises a control signal generating circuit adapted to generate a signal applied from an external portion in response to the test mode signal as the second control signal and disabling the second control signal in response to the normal mode signal.

4. The device of claim 3, wherein the control signal generating circuit comprises:

a CMOS transmission gate for transmitting the signal applied from the external portion in response to the test mode signal;

a first latch for inverting and latching an output signal of the CMOS transmission gate;

an inverter for inverting an output signal of the first latch to generate the second control signal; and a reset transistor for resetting the second control signal in response to the normal mode signal.

5. The device of claim 1, wherein the redundant fuse program circuit comprises:

a redundant control signal generating circuit for generating a redundant control signal in response to the first control signal; and a defective address programming circuit for receiving the address in response to the first control signal to program a fuse, so that the defective address is programmed.

6. The device of claim 5, wherein the redundant control signal generating circuit comprises:

a first fuse connected between a power voltage and a first node;

a first NMOS transistor serially connected between the first node and a ground voltage and receiving the address and the first control signal; and a second latch for inverting and latching an output signal of the first node to be outputted.

7. The device of claim 5, wherein the defective address programming circuit comprises:

a second fuse connected between a power voltage and a second node;

second and third NMOS transistors serially connected between the second node and a ground voltage and receiving the address and the first control signal; and a third latch for inverting and latching an output signal of the second node to be outputted.

8. The device of claim 2, further comprising:

a data output buffer for buffering and outputting a signal outputted from the signal output circuit to an external portion during a test operation.

9. A semiconductor memory device, comprising:

a memory cell array comprising a plurality of memory cells;

a defective address programming means for programming a redundant control signal and a defective address of a defective memory cell among the plurality of the memory cells at a package level in response to a first control signal and an address signal applied from an external portion;

an output means for outputting the defective address outputted from the defective address programming means to an external portion in response to a second control signal during a test operation; and a mode control signal setting means for setting a state of the first and second control signals in response to a command signal and a mode setting signal applied from an external portion.

10. The device of claim 9, wherein the output means further outputs the redundant control signal in response to the second control signal.

11. The device of claim 9, wherein the mode control signal setting means comprises:

a mode setting register for setting a state of the first control signal, a test mode signal and a normal mode signal in response to the command signal and the mode setting signal during a test operation at a package level;

a control signal generating means for generating a signal applied from an external portion in response to the test mode signal as the second control signal and disabling the second control signal in response to the normal mode signal.

12. The device of claim 11, wherein the control signal generating means comprises:

a CMOS transmission gate for transmitting the signal applied form the external portion in response to the test mode signal;

a first latch for inverting and latching an output signal of the CMOS transmission gate;

an inverter for inverting an output signal of the first latch to generate the second control signal; and a reset transistor for resetting the second control signal in response to the normal mode signal.

13. The device of claim 9, wherein the defective address programming means comprises:

a redundant control signal generating circuit for generating a redundant control signal in response to the first control signal; and a defective address programming circuit for receiving the address in response to the first control signal to program a fuse, so that the defective address is programmed.

14. The device of claim 13, wherein the redundant control signal generating circuit comprises:

a first fuse connected between a power voltage and a first node;

a first NMOS transistor serially connected between the first node and a ground voltage and receiving the address and the first control signal; and a second latch for inverting and latching an output signal of the first node to be outputted.

15. The device of claim 13, wherein the defective address programming circuit comprises:

a second fuse connected between a power voltage and a second node;

second and third NMOS transistors serially connected between the second node and a ground voltage and receiving the address and the first control signal; and a third latch for inverting and latching an output signal of the second node to be outputted.

16. The device of claim 10, wherein the output means comprises:
- a signal output means for outputting the redundant control signal and the defective address in response to the second control signal; and
- a data output buffer for buffering and outputting a signal outputted from the signal output circuit to an external portion during a test operation.

17. A method of identifying a programmed defective address in a semiconductor memory device having a memory cell array comprising a plurality of memory cells and a defective address programming means for programming a defective address of a defective memory cell among the plurality of the memory cells at a package level, the method comprising:

- generating a first control signal in response to a command signal and a mode setting signal applied from an external portion;
- programming the defective address programming means in response to the first control signal and a defective address applied from an external portion to generate a redundant control signal and a defective address;
- generating a second control signal in response to the command signal and the mode setting signal; and
- outputting a comparison coincident signal to an external portion in response to the second control signal when an address applied from an external portion is consistent with the defective address.

18. The method of claim 17, further comprising, outputting the redundant control signal to an external portion in response to the second control signal.

19. A method of identifying a programmed defective address in a semiconductor memory device having a memory cell array comprising a plurality of memory cells and a defective address programming means for programming a defective address of a defective memory cell among the plurality of the memory cells at a package level, the method comprising:

- generating a first control signal in response to a command signal and a mode setting signal applied from an external portion;
- programming the defective address programming means in response to the first control signal and a defective address applied from an external portion to generate a redundant control signal and a defective address;
- generating a second control signal in response to the command signal and the mode setting signal; and
- outputting the defective address to an external portion in response to the second control signal.

20. The method of claim 19, further comprising, outputting the redundant control signal to an external portion in response to the second control signal.

* * * * *